(12) United States Patent
Kim et al.

(10) Patent No.: US 12,446,304 B2
(45) Date of Patent: Oct. 14, 2025

(54) INTEGRATED CIRCUIT SEMICONDUCTOR ELEMENT HAVING HETEROGENEOUS GATE STRUCTURES AND METHOD OF FABRICATING INTEGRATED CIRCUIT SEMICONDUCTOR ELEMENT

(71) Applicant: SAMSUNG ELECTRONICS CO., LTD., Suwon-si (KR)

(72) Inventors: Kyungsoo Kim, Hwaseong-si (KR); Kyenhee Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 418 days.

(21) Appl. No.: 17/707,015

(22) Filed: Mar. 29, 2022

(65) Prior Publication Data

US 2023/0093897 A1     Mar. 30, 2023

(30) Foreign Application Priority Data

Sep. 27, 2021   (KR) .................. 10-2021-0127546

(51) Int. Cl.
H10D 84/01     (2025.01)
H10D 30/01     (2025.01)
(Continued)

(52) U.S. Cl.
CPC ......... H10D 84/853 (2025.01); H10D 30/031 (2025.01); H10D 30/6735 (2025.01);
(Continued)

(58) Field of Classification Search
CPC ............... H01L 27/0924; H01L 27/092; H01L 27/0688; H01L 27/0922; H01L 27/66545; H01L 27/0886; H01L 27/1211; H01L 27/10826; H01L 27/10879; H01L 21/823807; H01L 21/823821; H01L 21/82385; H01L 21/8221; H01L 21/823431; H01L 21/845; H01L 29/0665; H01L 29/42392; H01L 29/66742; H01L 29/78696; H01L 29/0673; H01L 29/66439; H01L 29/775; H01L 29/66795–66818;
(Continued)

(56) References Cited

U.S. PATENT DOCUMENTS 9,899,416 B2    2/2018   Kim et al.
10,388,519 B2   8/2019   Smith et al.
(Continued)

FOREIGN PATENT DOCUMENTS

KR   10-2020-0137259 A   12/2020
KR   10-2020-0139295 A   12/2020

OTHER PUBLICATIONS

Office Action in Korean Appln. No. 10-2021-0127546, mailed on Feb. 18, 2025, 17 pages (with English translation).

*Primary Examiner* — David Vu
(74) *Attorney, Agent, or Firm* — Fish & Richardson P.C.

(57) ABSTRACT

An integrated circuit semiconductor element includes: a substrate; a complementary field effect transistor (FET) (cFET) formed over the substrate and having a quadruple-gate structure, in which nano sheet stacked structures are sequentially stacked; and a planar FET having a mono-gate structure or a zebra fin FET (ZE FINFET) having a triple-gate structure, which are formed over the substrate.

15 Claims, 14 Drawing Sheets

(51) Int. Cl.
    *H10D 30/67*  (2025.01)
    *H10D 62/10*  (2025.01)
    *H10D 64/01*  (2025.01)
    *H10D 84/03*  (2025.01)
    *H10D 84/85*  (2025.01)

(52) U.S. Cl.
    CPC ....... *H10D 30/6757* (2025.01); *H10D 62/118* (2025.01); *H10D 84/0167* (2025.01); *H10D 84/0193* (2025.01); *H10D 84/038* (2025.01)

(58) Field of Classification Search
    CPC ..... H01L 29/785; H01L 29/7855–7856; H01L 29/41791; H01L 29/16–1608; H01L 29/18–185; H01L 29/22–2206; H01L 2029/7857–7858; H01L 2924/13067; B82Y 10/00
    See application file for complete search history.

(56) References Cited

U.S. PATENT DOCUMENTS

| | | |
|---|---|---|
| 10,756,089 B2 | 8/2020 | Chiang et al. |
| 10,964,823 B2 | 3/2021 | Wang |
| 10,991,711 B2 | 4/2021 | Reznicek et al. |
| 11,217,695 B2 | 1/2022 | Lee et al. |
| 11,398,475 B2 | 7/2022 | Suh et al. |
| 2020/0105761 A1* | 4/2020 | Liaw ................. H01L 21/02603 |
| 2020/0411515 A1 | 12/2020 | Kim et al. |
| 2021/0175128 A1 | 6/2021 | Gardner et al. |
| 2021/0225839 A1* | 7/2021 | Lin ................. H01L 21/823462 |
| 2021/0375683 A1* | 12/2021 | Lin ................... H01L 21/02532 |

* cited by examiner

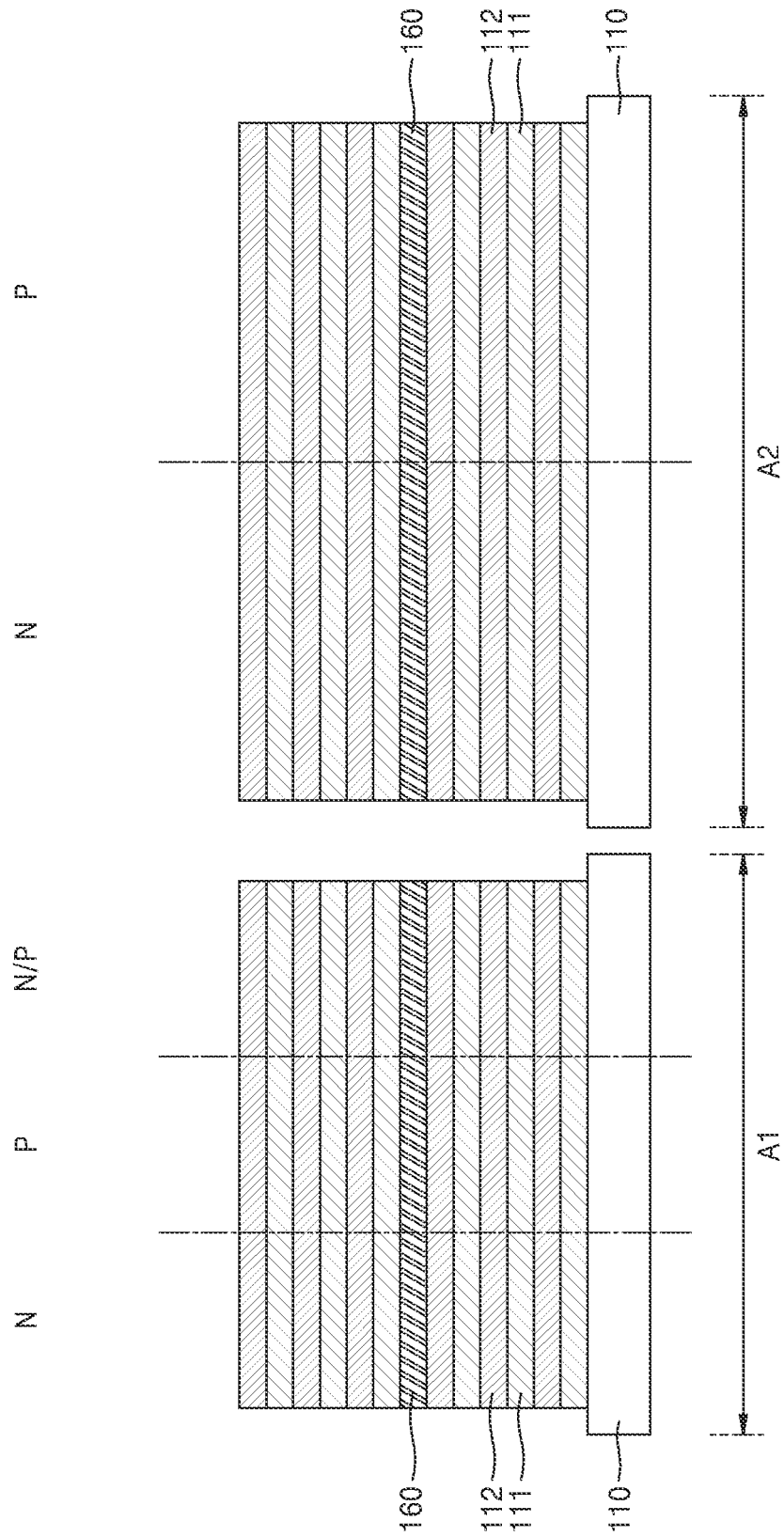

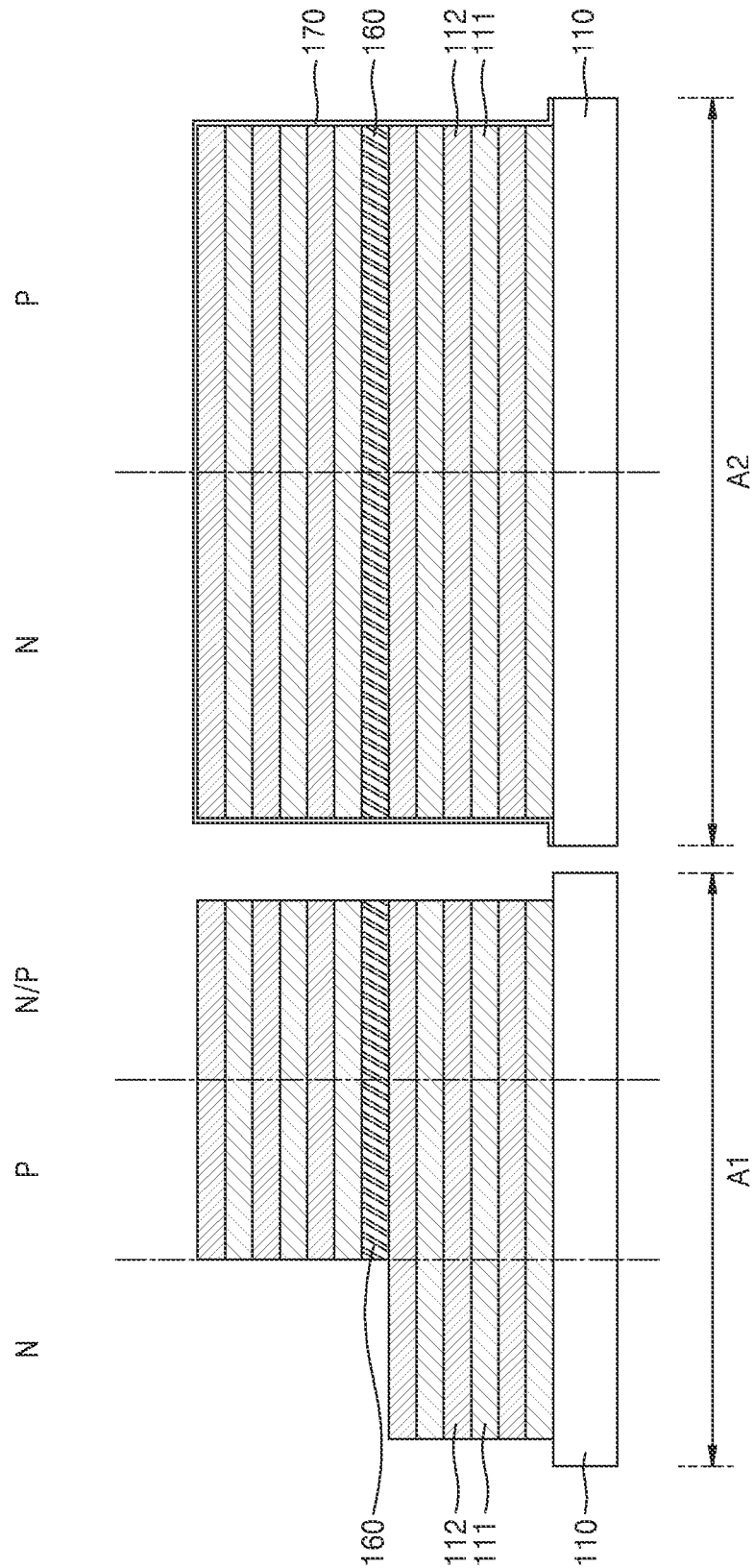

INTEGRATED CIRCUIT SEMICONDUCTOR ELEMENT HAVING HETEROGENEOUS GATE STRUCTURES AND METHOD OF FABRICATING INTEGRATED CIRCUIT SEMICONDUCTOR ELEMENT

CROSS-REFERENCE TO RELATED APPLICATION

This application is based on and claims priority under 35 U.S.C. § 119 to Korean Patent Application No. 10-2021-0127546, filed on Sep. 27, 2021 in the Korean Intellectual Property Office, the disclosure of which is incorporated by reference herein in its entirety.

BACKGROUND

The inventive concept relates to an integrated circuit semiconductor element, and more particularly, to an integrated circuit semiconductor element including a plurality of transistors and a method of fabricating the integrated circuit semiconductor elements.

In the integrated circuit semiconductor elements, all transistors operating at low voltages and transistors operating at high voltages are required to be reliably fabricated. As the integrated circuit semiconductor elements are highly integrated, the transistors include three-dimensional (3D) transistors, as opposed to flat surface-type transistors. However, it is becoming increasingly difficult to form the 3D transistors operating at high and low voltages, with the desired reliability.

SUMMARY

The inventive concept provides an integrated circuit semiconductor element in which three-dimensional (3D) transistors operating at high and low voltages are formed with high reliability on a substrate, and a method of fabricating the integrated circuit semiconductor elements.

According to an aspect of the inventive concept, there is provided an integrated circuit semiconductor element including: a substrate; a complementary field effect transistor (FET) (cFET) formed over the substrate and having a quadruple-gate structure, in which nano sheet stacked structures are sequentially stacked; and a planar FET having a mono-gate structure or a zebra fin FET (ZE FINFET) having a triple-gate structure, which are formed over the substrate.

In addition, according to another aspect of the inventive concept, there is provided an integrated circuit semiconductor element including: a substrate; a complementary field effect transistor (FET) (cFET) formed over the substrate and having a quadruple-gate structure in which nano sheet stacked structures are sequentially stacked; and a fin FET (FINFET) formed over the substrate and having a triple-gate structure, wherein the cFET includes a first active fin formed on the substrate, a nano sheet stacked structure formed over the first active fin, a first dielectric layer surrounding the nano sheet stacked structure, and a first gate electrode formed on the first dielectric layer, wherein the FINFET includes a second active fin formed on the substrate, a second dielectric layer surrounding the second active fin, and a second gate electrode formed on the second dielectric layer, wherein an upper surface of the second active fin is at a higher level than an upper surface of the first active fin in a vertical direction with respect to a surface of the substrate.

Furthermore, according to another aspect of the inventive concept, there is provided a fabrication method of an integrated circuit semiconductor element, the fabrication method including: preparing a substrate on which a first region and a second region are defined; forming fins in the first region and the second region; and forming a gate electrode covering the fin, and forming a complementary field effect transistor (FET) (cFET) and a fin FET (FINFET), where nano sheet stacked structures are sequentially stacked, wherein, in the forming of the fin, a first active fin extending in a first direction and having a first height in the first region and a nano sheet stacked structure over the first active fin are formed, and a second active fin extending in the first direction and having a second height in the second region is formed, wherein, in the forming of the cFET and the FINFET, the cFET is formed by forming a first gate electrode having a quadruple-gate structure covering both side surfaces, an upper surface, and a lower surface of the nano sheet stacked structure in the first region, and the FINFET is formed by forming a second gate electrode having a triple-gate structure covering both side surfaces and an upper surface of the second active fin in the second region.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE PREFERRED EMBODIMENTS

Figure 1:
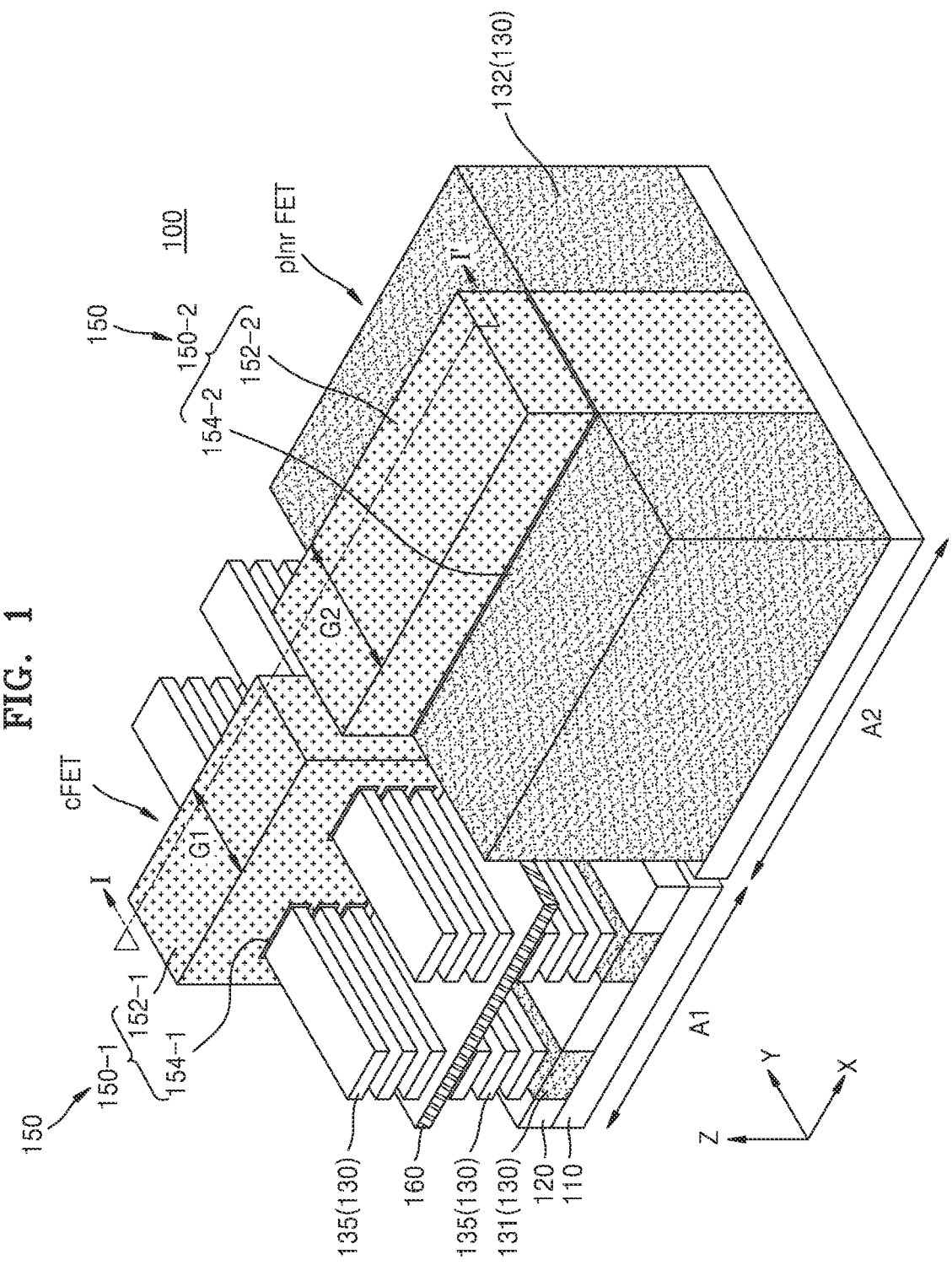
FIGS. 1 through 3 are perspective views of a semiconductor element equipped with field effect transistors having heterogeneous gate structures, according to exemplary embodiments.

Hereinafter, exemplary embodiments of the inventive concept are described in detail with reference to the accompanying drawings. Identical reference numerals are used for the same constituent elements in the drawings, and duplicate descriptions thereof are omitted as redundant.

Figure 2:
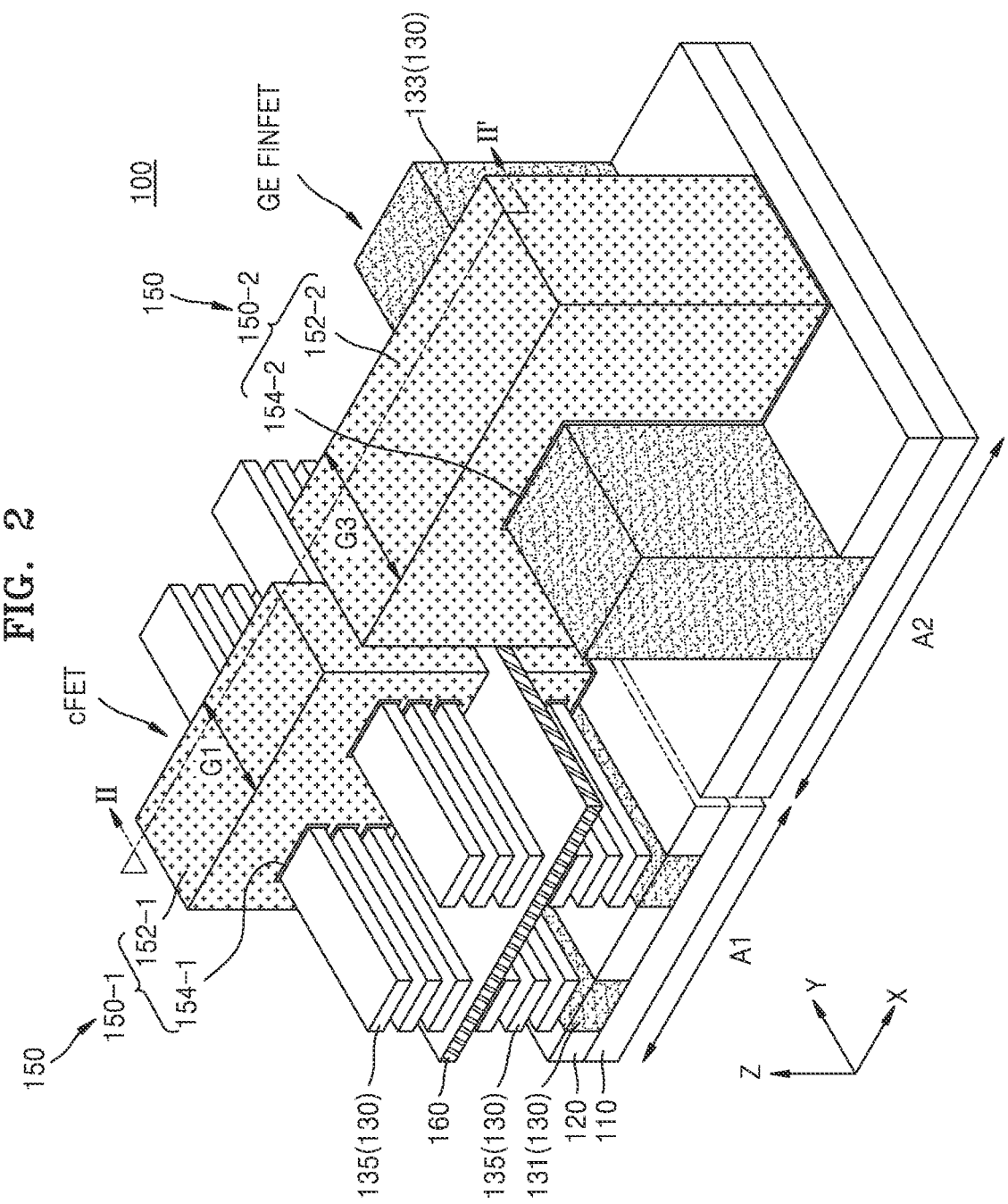
Figure 3:
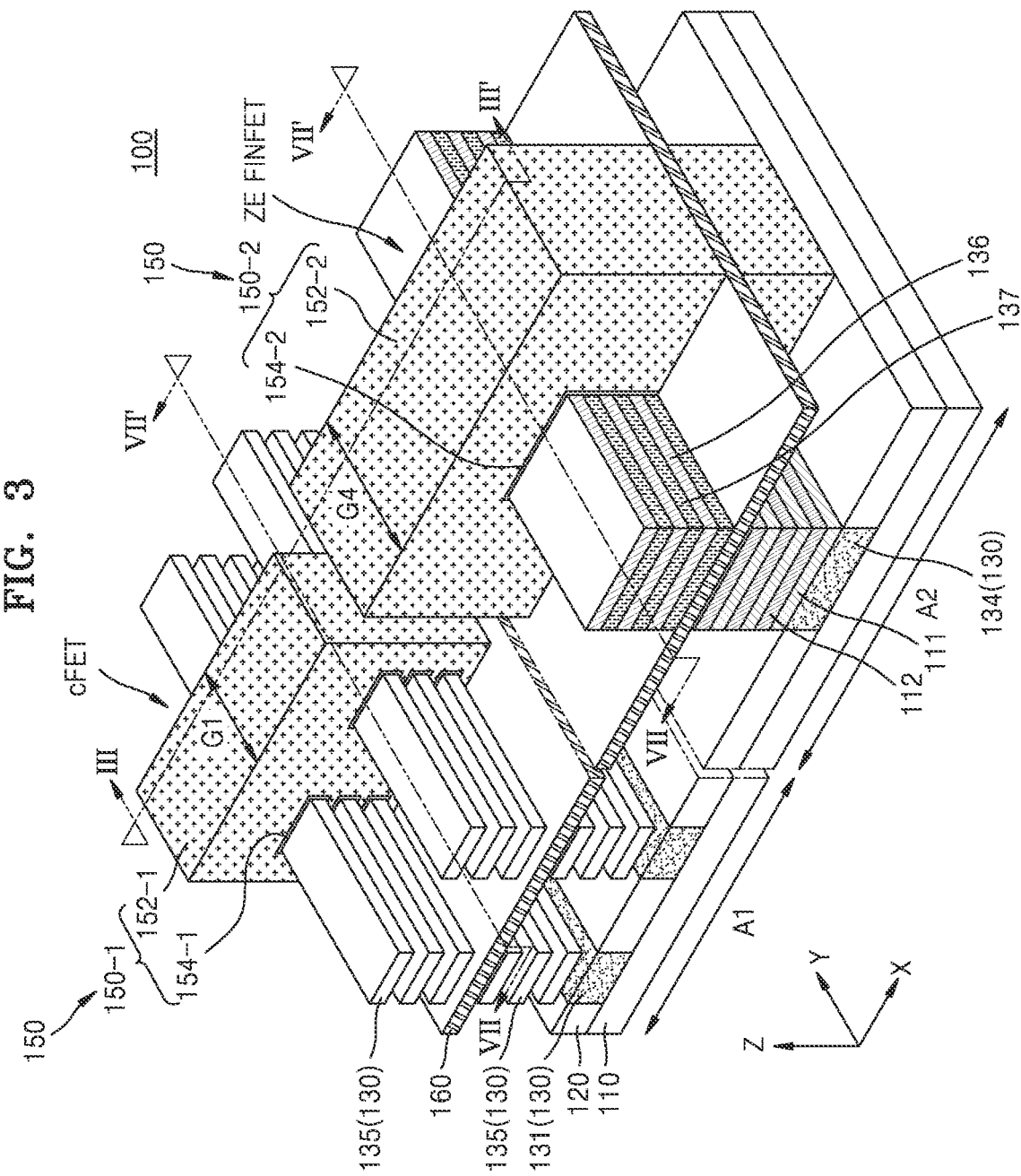

FIGS. 1 through 3 are perspective views of a semiconductor element 100 including field effect transistors (FETs) having heterogeneous gate structures, according to exemplary embodiments.

Figure 4:
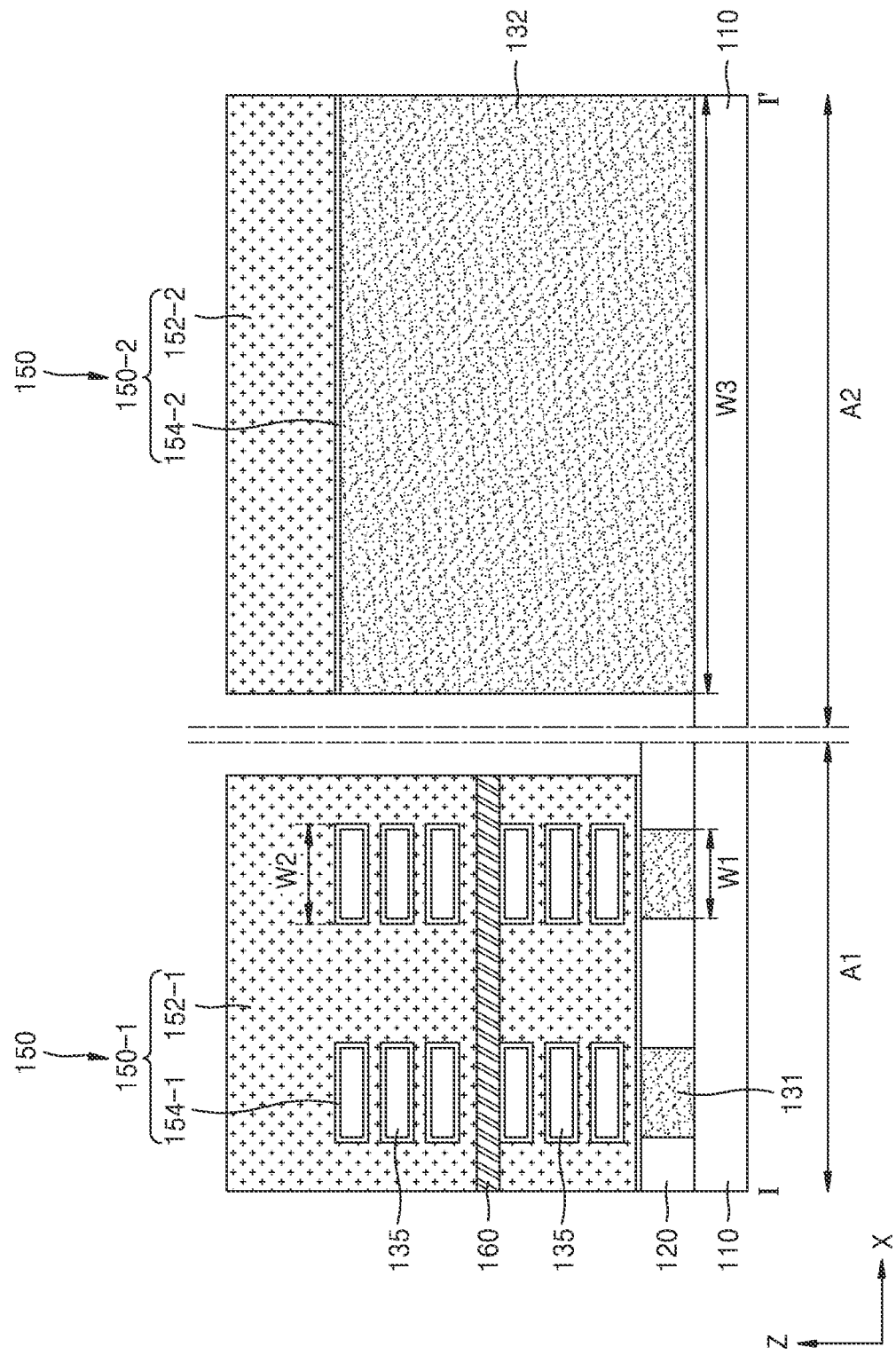
FIG. 4 is a cross-sectional view of a region I-I' of the semiconductor element of FIG. 1.

FIG. 4 is a cross-sectional view of a region I-I' of the semiconductor element 100 of FIG. 1.

Figure 5:
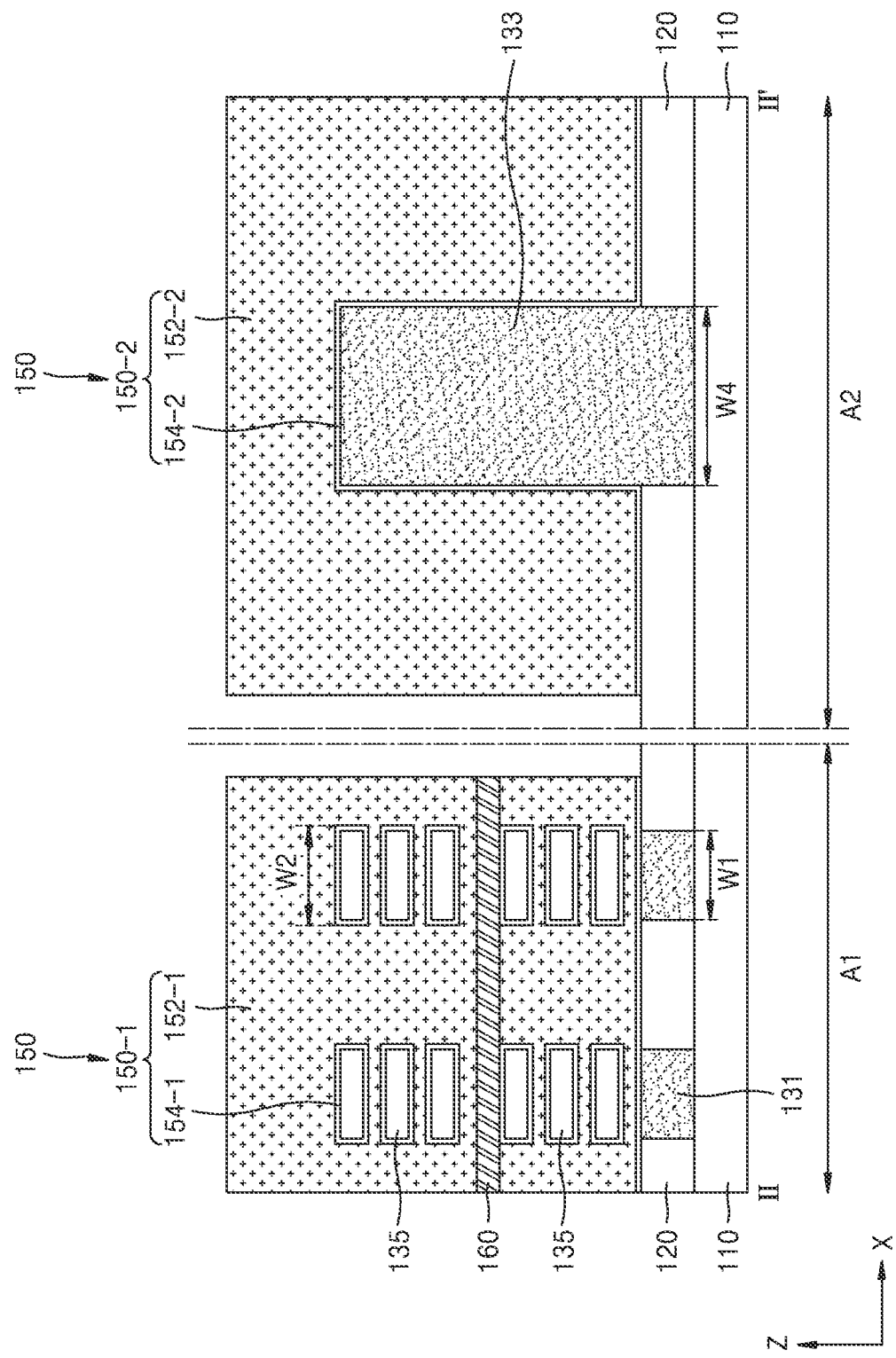
FIG. 5 is a cross-sectional view of a region II-II' of a semiconductor element of FIG. 2.

FIG. 5 is a cross-sectional view of a region II-II' of the semiconductor element 100 of FIG. 2.

Figure 6:
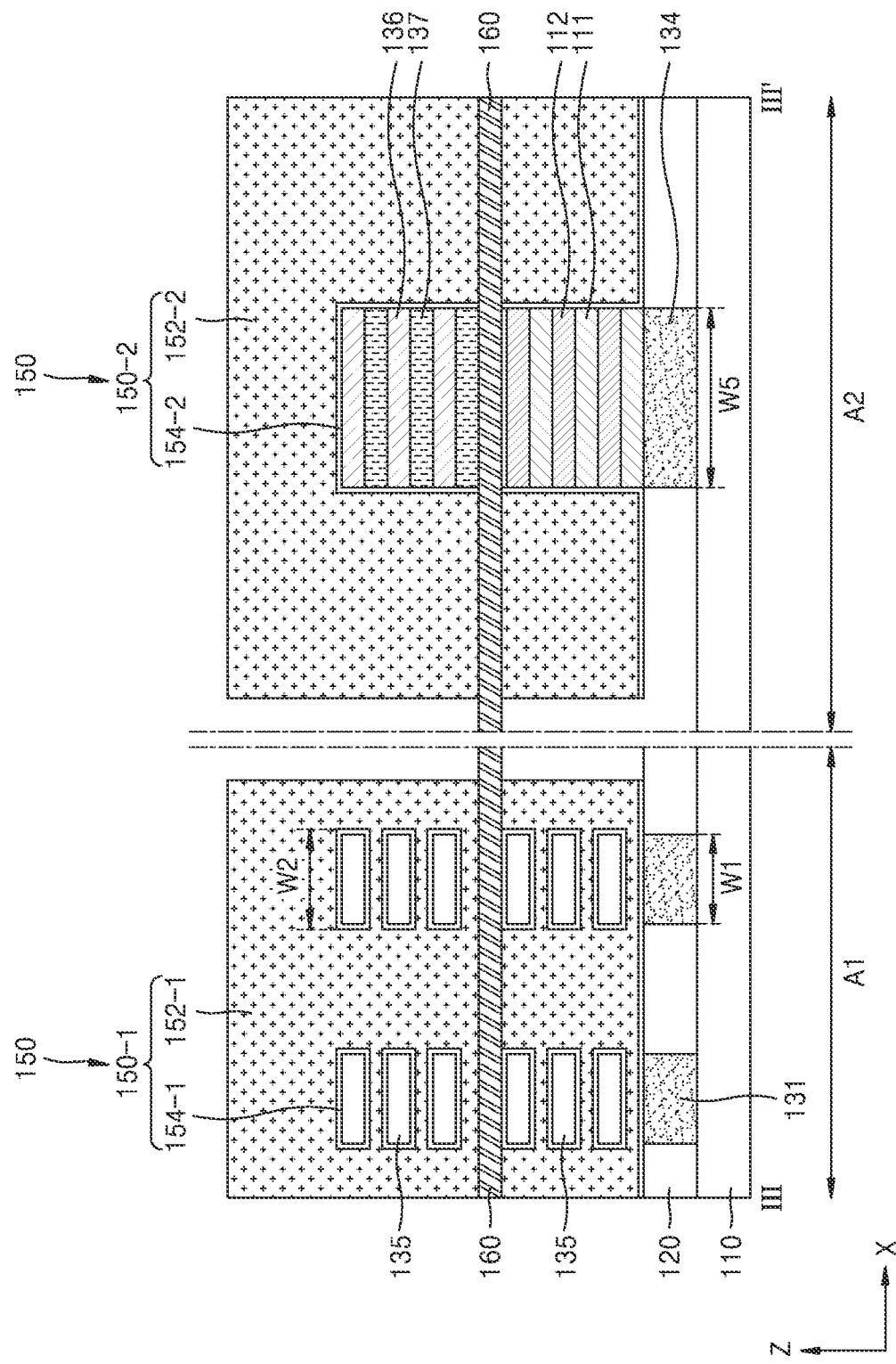
FIG. 6 is a cross-sectional view of a region III-III' of a semiconductor element of FIG. 3.

FIG. 6 is a cross-sectional view of a region III-III' of the semiconductor element 100 of FIG. 3.

Referring to FIGS. 1 through 6, the semiconductor element 100 of the present exemplary embodiment may include FETs of heterogeneous gate structures on a substrate 110. For example, the semiconductor element 100 of the present exemplary embodiment may include at least one of a complementary FET cFET, a planar FET plnr FET, and a fin FET FINFET.

The integrated circuit semiconductor element 100 may include a first region A1 and a second region A2 on the substrate 110. In some exemplary embodiments, the first region A1 may include a logic cell region operating only at a low voltage, for example, less than about 1 V. The logic cell region may include a region where the complementary FET cFET is formed. The complementary FET cFET may include a metal-oxide-semiconductor (MOS) transistor.

The second region A2 may be an input/output region operating at a high voltage, for example, equal to or greater than about 1 V. The input/output region may include the planar FET plnr FET or the fin FET FINFET. The fin FET FINFET may include a general (GE) fin FET GE FINFET or a zebra (ZE) fin FET ZE FINFET. The general fin FET GE FINFET may have a concept comparable to the zebra fin FET ZE FINFET described below.

The semiconductor element 100 may include a substrate 110, an element separation layer 120, a semiconductor layer 130, a gate structure 150, and/or an insulation layer 160.

The substrate 110 may include silicon (Si), for example, monocrystalline silicon, polycrystalline silicon, or amorphous silicon. However, a material of the substrate 110 is not limited to Si. For example, in some exemplary embodiments, the substrate 110 may include a Group IV semiconductor such as germanium (Ge), a Group IV-IV compound semiconductor such as silicon germanium (SiGe) or silicon carbide (SiC), or a Group III-V compound semiconductor such as gallium arsenide (GaAs), indium arsenide (InAs), and indium phosphide (InP).

The substrate 110 may also be based on a Si bulk substrate, or a silicon on insulator (SOI) substrate. In the semiconductor element 100 of the present exemplary embodiment, the substrate 110 may be based on the Si bulk substrate. In addition, the substrate 110 is not limited to the Si bulk substrate or the SOI substrate, and may also include a substrate based on an epitaxial wafer, a polished wafer, an annealed wafer, etc.

Although not illustrated, the substrate 110 may include a conductive region, for example, a well doped with impurities, or various structures doped with impurities. In addition, the substrate 110 may form a p-type substrate or an n-type substrate depending on the kind of an impurity ion.

The substrate 110 may be classified into various regions depending on the types of elements formed thereon. For example, the substrate 110 may be divided into the first region A1 where logic elements or operation elements are formed, and the second region A2 where input/output (I/O) elements or interface-related elements are formed. However, regions of the substrate 110 may not be differentiated only as the first region A1 and the second region A2. For example, the substrate 110 may be divided into three or more regions depending on the kinds of elements formed on the substrate 110.

The element separation layer 120 may be arranged on the substrate 110 with a certain height, and may include an insulation material. For example, the element separation layer 120 may include any one of an oxide layer, a nitride layer, and an oxynitride layer. The element separation layer 120 may be arranged between first active fins 131, and between second active fins 133 and 134 of the fin FET FINFET, and accordingly, may electrically separate the first active fins 131 from each other, and electrically separate the second active fin 133 and the second active fin 134 from each other of the fin FET FINFET.

The semiconductor layer 130 may have a fin shape, a sheet shape, and/or a planar shape. The semiconductor layer 130 may include the first active fin 131 arranged inside the element separation layer 120 in the first region A1, and the second active fins 132, 133, and 134 in the second region A2. The semiconductor layer 130 may be formed by etching a portion of the substrate 110.

In addition, the semiconductor layer 130 may include a nano sheet stacked structure 135 arranged above the first active fin 131 in the first region A1.

On the other hand, referring to FIGS. 1 through 3, two first active fins 131 formed inside the element separation layers 120, and the nano sheet stacked structure 135 arranged over the first active fin 131 are formed in the first region A1, and each one of the second active fins 132, 133, and 134 is formed in the second region A2, but this is only an exemplary illustration for convenience of description. For example, in the first region A1, three or more first active fins 131 may be formed inside the element separation layer 120, or only one first active fin 131 may be arranged inside the element separation layer 120. For example, the planar FET plnr FET may not include the element separation layer 120.

In addition, two or more of the second active fins 132, 133, and 134 may be arranged in the second region A2.

The nano sheet stacked structure 135 may include a plurality of first nano sheets, which are separated from each other in a first direction (Z direction) with respect to a surface of the substrate 110, that is, a vertical direction and/or a third direction (X direction). In the drawings, twelve first nano sheets are stacked in the gate structure 150 in the first region A1, but more or less than twelve first nano sheets may be stacked.

Structures of the first active fin 131 and the second active fins 132, 133, and 134 may be different from, or the same as each other. In the semiconductor element 100 of the present embodiment, the structures of the first active fin 131 and the second active fins 132, 133, and 134 may be different from each other. The first active fin 131 may have a structure which protrudes from the substrate 110, and extends in a second direction (Y direction).

The second active fins 132, 133, and 134 may also have structures which protrude from the substrate 110, and extend in the second direction (Y direction). However, the extending directions of the first active fin 131 and the second active fins 132, 133, and 134 may not necessarily be identical.

An upper surface of the first active fin 131 of the complementary FET cFET may be substantially on an identical surface to an upper surface of the element separation layer 120. An upper surface of the second active fin 132 of the planar FET plnr FET may be higher than the upper surface of the first active fin 131. Upper surfaces of the second active fins 133 and 134 of the fin FET FINFET may be higher than the upper surface of the element separation layer 120.

In addition, an upper surface of the nano sheet stacked structure 135 may be substantially at an identical level to the upper surfaces of the second active fins 132, 133, and 134. According to an exemplary embodiment, the upper surface of the nano sheet stacked structure 135 may be substantially on an identical flat surface as the upper surfaces of the second active fins 132, 133, and 134.

Referring to FIGS. 4 through 6, cross-sections of the first active fin 131 and the second active fins 132, 133, and 134 may have rectangular structures.

According to another exemplary embodiment, the second active fins 132, 133, and 134 may have a trapezoidal structure or a tapered structure, in which upper sides are relatively short and lower sides are relatively long. In this manner, when the second active fins 132, 133, and 134 are formed in a tapered structure, due to its structural characteristics, a band to band tunneling (BTBT) increase and a field concentration at top portions may be more efficiently mitigated.

The second active fins 132, 133, and 134 of a tapered structure may be implemented by adjusting the anisotropic etching rate by properly adjusting an etching gas, and an etching process condition, when the second active fins 132, 133, and 134 are formed from the substrate 110. In addition, by individually etching the first active fin 131 and the second active fins 132, 133, and 134, the first active fin 131 may be formed in a rectangular structure, and the second active fins 132, 133, and 134 may be formed in a tapered structure. In addition, by simultaneously etching the first active fin 131 and the second active fins 132, 133, and 134, both the first active fin 131 and the second active fins 132, 133, and 134 may be formed in a tapered structure.

The first active fin 131 and the second active fins 132, 133, and 134 may be formed based on the substrate 110. Accordingly, the first active fin 131 and the second active fins 132, 133, and 134 may include the same material as the substrate 110. On the other hand, portions of the first active fin 131 and the second active fins 132, 133, and 134 on both side surfaces of the gate structure 150 may be doped with impurity ions at high concentrations, and constitute source and drain regions (141 and 142 in FIG. 7) in the third direction (X direction).

The nano sheet stacked structure 135 may be arranged over the first active fin 131 in the first region A1, in which the complementary FET cFET is arranged, and the nano sheet stacked structure 135 may include a single first nano sheet or a plurality of first nano sheets. Each first nano sheet may have a sheet shape. The nano sheet stacked structure 135 may include an n-type FET and/or a p-type FET. The nano sheet stacked structure 135 may include the same as material as the first active fin 131 or the second active fins 132, 133, and 134. The first nano sheets may include an n-type FET and/or a p-type FET.

As illustrated in FIG. 4, a cross-section of each of the first active fin 131, the second active fin 132 of the planar FET plnr FET, and the nano sheet stacked structure 135 may have a rectangular shape.

When the fin FET FINFET is arranged in the second region A2, the upper surfaces of the second active fins 133 and 134 may be at a higher level than the upper surface of the element separation layer 120. As illustrated in FIGS. 5 and 6, a cross-section of each of the first active fin 131, the second active fins 133 and 134, and the first nano sheet may have a rectangular shape.

The second active fins 132 and 133 of each of the planar FET plnr FET and the general fin FET GE FINFET may include one semiconductor layer. In contraposition, the second active fin 134 of the zebra fin FET ZE FINFET may include several semiconductor layers.

In FIGS. 3 and 6, for convenience of description, a zebra cap layer (170 in FIG. 7) is not illustrated. The second active fin 134 of the zebra fin FET ZE FINFET may include nano sheet layers 111 and 112, a second nano sheet 136, and/or a semiconductor pattern 137. The second nano sheet 136 and/or the semiconductor pattern 137 may include an epitaxial layer. The second nano sheet 136 may include a silicon germanium (SiGe) layer, and the semiconductor pattern 137 may include a silicon (Si) layer.

The nano sheet layer 112 and the second nano sheet 136, which are substantially on the same level as the first nano sheet forming the nano sheet stacked structure 135, may include SiGe. The first nano sheet layer 111, which is not substantially on the same level as the first nano sheet forming the nano sheet stacked structure 135, may include Si.

The gate structure 150 may be formed on the element separation layer 120 as a structure, which covers the first active fin 131, the second active fins 132, 133, and 134, and the nano sheet stacked structure 135, and extends in the third direction (X direction). In FIGS. 1 through 6, one gate structure 150 is arranged in the semiconductor element 100, but this is only an exemplary illustration for convenience of description. For example, two or more gate structures 150 may be formed in the third direction (X direction).

The gate structure 150 may include a first gate structure 150-1 formed on the first active fin 131, and a second gate structure 150-2 formed on the second active fins 132, 133, and 134. The first gate structure 150-1 may be different from the second gate structure 150-2.

The first gate structure 150-1 may include a first dielectric layer 154-1 and a first gate electrode 152-1, and the second gate structure 150-2 may include a second dielectric layer 154-2 and a second gate electrode 152-2. The first dielectric layer 154-1 may cover the upper surface of the first active fin 131 arranged between the element separation layers 120, cover both side surfaces, an upper surface, and a lower surface of the first nano sheet arranged over the first active fin 131, and have a uniform thickness. The second dielectric layer 154-2 may cover both side surfaces and/or upper surfaces of the second active fins 132, 133, and 134.

Accordingly, the first dielectric layer 154-1 in the first region A1 may use all surfaces of the first nano sheet as channels, by covering the upper surface of the first active fin 131, and both side surfaces, the upper surface, and/or the lower surface of the first nano sheet. A structure in which all surfaces of the first nano sheet are used as channels may be referred to as a quadruple-gate structure, and accordingly, the complementary FET cFET may have a quadruple-gate structure. In other words, the complementary FET cFET may have a gate-all-around (GAA) structure.

On the other hand, a shape of the second dielectric layer 154-2 may be changed according to the structure of the second active fins 132, 133, and 134. When the planar FET plnr FET is arranged in the second region A2, the second dielectric layer 154-2 may cover only the upper surface of the second active fin 132. Accordingly, only the upper surface of the second active fin 132 may be used as a channel, and a structure of this type may be referred to as a mono-gate structure.

On the other hand, when the fin FET FINFET is arranged in the second region A2, the second dielectric layer 154-2 may cover the both side surfaces and the upper surfaces of the second active fins 133 and 134. Accordingly, both side surfaces and the upper surfaces of the second active fins 133 and 134 may be used as channels, and a structure of this type may be referred to as a triple-gate structure.

The first dielectric layer 154-1 and the second dielectric layer 154-2 may include an insulation material. For example, the first dielectric layer 154-1 and the second dielectric layer 154-2 may include oxide such as a silicon oxide ($SiO_2$) or nitride such as silicon nitride ($SiN_x$).

The first dielectric layer 154-1 and the second dielectric layer 154-2 may also include a high-k dielectric material having a high dielectric constant. For example, the first dielectric layer 154-1 and the second dielectric layer 154-2 may include hafnium oxide ($HfO_2$), hafnium silicon oxide ($HfSiO_4$), lanthanum oxide ($La_2O_3$), and lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), red scandium tantalum oxide ($PbSc_{0.5}T_{0.5a}O_3$), red zinc niobate ($PbZnNbO_3$), etc.

The first dielectric layer 154-1 and the second dielectric layer 154-2 may include metal oxide, silicates thereof, or aluminates thereof. The metal oxide may include, for example, $HfO_2$, $ZrO_2$, $TiO_2$, $Al_2O_3$, etc. In addition, the first dielectric layer 154-1 and the second dielectric layer 154-2 may include metal nitride oxide, silicates thereof, or aluminates thereof. The metal nitride oxide may include, for example, aluminum oxynitride (AlON), zirconium oxynitride (ZrON), hafnium oxynitride (HfON), lanthanum oxynitride (LaON), yttrium oxynitride (YON), etc. Silicates or aluminates may include, for example, zirconium silicon oxynitride (ZrSiON), hafnium silicon oxynitride (HfSiON), lanthanum silicon oxynitride (LaSiON), yttrium silicon oxynitride (YsiON), zirconium aluminum oxynitride (ZrAlON), hafnium aluminum oxynitride (HfAlON), etc.

The first dielectric layer 154-1 and the second dielectric layer 154-2 may also include perovskite-type oxide, a niobate or tantalate system material, a tungsten-bronze system material, a bi-layered perovskite system material, etc.

The first dielectric layer 154-1 and the second dielectric layer 154-2 including these materials may be formed by using various deposition methods such as chemical vapor deposition (CVD), low pressure CVD (LPCVD), an atmospheric pressure CVD (APCVD), low temperature CVD (LTCVD), plasma enhanced CVD (PECVD), atomic layer CVD (ALCVD), atomic layer deposition (ALD), physical vapor deposition (PVD), etc.

According to another exemplary embodiment, the first dielectric layer 154-1 and the second dielectric layer 154-2 may also be formed on the element separation layer 120. Depending on the case, the first dielectric layer 154-1 and the second dielectric layer 154-2 may omitted from the element separation layer 120.

The first gate electrode 152-1 may cover the upper surface of the first active fin 131, and cover both side surfaces, the upper surface, and the lower surface of the first nano sheet, with the first dielectric layer 154-1 therebetween, and the second gate electrode 152-2 may cover only the upper surfaces, or both side surfaces and the upper surfaces of the second active fins 132, 133, and 134, with the second dielectric layer 154-2 therebetween. Accordingly, the first active fin 131, the nano sheet stacked structure 135, the first dielectric layer 154-1, and the first gate electrode 152-1 may constitute the complementary FET cFET, and the second active fins 132, 133, and 134, the second dielectric layer 154-2, and the second gate electrode 152-2 may constitute the planar FET plnr FET and/or the fin FET FINFET. The first gate electrode 152-1 and the second gate electrode 152-2 may be formed in a structure extending in the third direction (X direction) with respect to the gate structure 150 as described above.

On the other hand, the first gate electrode 152-1 may not be electrically connected to the second gate electrode 152-2. This is because an operational voltage of the first gate electrode 152-1 required by elements in the first region A1 may be different from an operational voltage of the second gate electrode 152-2 required by elements in the second region A2.

As illustrated in FIGS. 1 through 3, a second direction (Y direction) width of the first gate electrode 152-1 may be different from a second direction (Y direction) width of the second gate electrode 152-2. For example, the second direction (Y direction) width of the first gate electrode 152-1 may be formed smaller than the second direction (Y direction) width of the second gate electrode 152-2. A width of a gate electrode may correspond to a gate length and/or a channel length.

On the other hand, the second direction (Y direction) width of the first gate electrode 152-1 may constitute a first gate length G1 of the complementary FET cFET. In addition, the second direction (Y direction) width of the second gate electrode 152-2 may constitute second gate lengths G2, G3, and G4 of the planar FET plnr FET, the general fin FET GE FINFET, and the zebra fin FET ZE FINFET, respectively.

The first gate length G1 may be less than the second gate lengths G2, G3, and G4. An inverse of ratios of the first gate length G1 to the second gate lengths G2, G3, and G4 may range from about 150% to 1000%.

The first and second gate lengths G1, G2, G3, and G4 may correspond to respective channel lengths. A channel length of the complementary FET cFET may be referred to as a first length, a channel length of the planar FET plnr FET may be referred to as a second length, and a channel length of the fin FET FINFET may be referred to as a third length. An inverse of ratios of the first length to the second length and/or the third length may range from about 150% to about 1000%.

Referring to FIGS. 4 through 6, a width W1 of the first active fin 131, a width W2 of the nano sheet stacked structure 135, and widths W3, W4, and W5 of the second active fins 132, 133, and 134, respectively, may be defined in the third direction (X direction), which is perpendicular to the gate lengths G1, G2, G3, and G4, and the channel lengths, which are described above.

The width W1 of the first active fin 131 may be referred to as a first width, the widths W3, W4, and W5 of the second active fins 132, 133, and 134, respectively, may be referred to as a second width, and the width W2 of the nano sheet stacked structure 135 may be referred to as a third width. The first width may be the same as the third width. In addition, a ratio of the first second width to the first width may range from about 150% to about 1000%. In other words, channels formed by the second active fins 132, 133, and 134 may formed longer than channels formed by the first active fin 131 and the nano sheet stacked structure 135, in the second direction (Y direction) and/or the third direction (X direction).

The first gate electrode 152-1 and the second gate electrode 152-2 may include polycrystalline silicon, or a conductive material in which a metal material such as aluminum (Al), nickel (Ni), tungsten (W), titanium (Ti) and tantalum (Ta) is doped on the polycrystalline silicon. In addition, the first gate electrode 152-1 and the second gate electrode 152-2 may also include a metal. For example, the first gate electrode 152-1 and the second gate electrode 152-2 may include titanium nitride (TiN), tantalum nitride (TaN), titanium carbide (TiC), tantalum carbide (TaC), etc. The first gate electrode 152-1 and the second gate electrode 152-2 may be formed in a single layer or be multi-layer.

The insulation layer 160 may be arranged over the substrate 110 with a certain height, and may include an insulation material. The insulation layer 160 may be formed in a direction parallel with the substrate 110. For example, the insulation layer 160 may include any one of an oxide layer, a nitride layer, or an oxynitride layer. The insulation layer 160 may physically divide the gate structure 150 into an upper region and a lower region.

The insulation layer 160 may be formed to penetrate the first gate structure 150-1 in the first region A1, and when the zebra fin FET ZE FINFET is arranged in the second region A2, the insulation layer 160 may be formed to penetrate the second gate structure 150-2 and the second active fin 134 of the zebra fin FET ZE FINFET.

The insulation layer 160 may electrically separate the gate structure 150 so that the semiconductor layers 130 of different types are arranged in the upper region of the gate structure 150 and the lower region of the gate structure 150.

The upper region of the gate structure 150 and the lower region of the gate structure 150, which are divided by the insulation layer 160, may be referred to as a top tier and a bottom tier, respectively.

For example, an n-type FET may be arranged in the bottom tier in the first region A1, and a p-type FET may be arranged in the top tier in the first region A1. However, this is only an example, and it may also be possible that a p-type FET is arranged in the bottom tier in the first region A1, and an n-type FET is arranged in the top tier in the first region A1.

Even though six first nano sheets are arranged in the bottom tier and six first nano sheets are arranged in the top tier as an example in the drawings, these are only examples, and five or less first nano sheets or seven or more first nano sheets may be arranged in each tier.

According to an exemplary embodiment, a first direction (Z direction) height of the top tier may be greater than a first direction (Z direction) height of the bottom tier.

The complementary FET cFET may include transistors of different conductivity types stacked alternately and three-dimensionally, and accordingly, a cell area of the semiconductor element 100 may be reduced.

When the complementary FET cFET having a quadruple-gate structure is formed in the first region A1, where the logic elements are formed, and the planar FET plnr FET having a mono-gate structure or the fin FET FINFET having a triple-gate structure is formed in the second region A2, where the I/O elements are formed, the semiconductor element 100 according to the present exemplary embodiment may contribute to improvement in the performance of the logic elements as well as improvement in the reliability of the I/O elements, and also prevention of a leakage current.

In addition, in the case of the logic elements, the complementary FET cFET may be formed in various sizes according to their functions. Thus, by forming, in the first region A1, the complementary FET cFET having a quadruple-gate structure, the planar FET plnr FET having a mono-gate structure, or the fin FET FINFET having a triple-gate structure, in a proper combination for each I/O element in the first region A1, the semiconductor element 100 according to the present exemplary embodiment may contribute to improvement in the performance of the entirety of logic elements.

For reference, a logic element formed in the first region A1 may be used in a graphics card chip or a low-power chip such as a mobile application processor. The logic element may execute various operations and logics, as an element, which actually performs a computation operation like a central processing unit (CPU), a ratio of the leakage current to an effective current may be an important factor in the performance of the logic element. For example, the CPU may require a high effective current value even with much leakage current, and a chip used as a graphics card may require an effective current value even with less leakage current than the CPU. In addition, because an effective current value as well as power consumption is important for the mobile application processor, a leakage current value may be required to be maintained low.

On the other hand, the I/O element formed in the second region A2 may, as an element performing a function of another type, for example, an element functioning as an interface with a memory element or the like, receive an external voltage, transfer an external voltage to a logic element, receive an input from the logic element, and output the received input.

However, when a fabrication process of a fin structure for a logic element is performed, reliability and leakage current characteristics of the I/O element, such as hot carrier injection (HCI), bias temperature instability (BTI), and time dependent dielectric breakdown (TDDB) may be significantly weakened. For example, when a width of a fin of a logic element is shortened, a width of the fin of the I/O element may also be shortened, and thus, a lateral field generating hot carrier at a top portion of a fin, the BTBT generating a gate induced drain leakage (GIDL), and an oxide field increasing the BTI and the TDDB may be maximized.

When the complementary FET cFET having a quadruple-gate structure is formed in the first region A1, where the logic elements are formed, and the planar FET plnr FET having a mono-gate structure or the fin FET FINFET having a triple-gate structure is formed in the second region A2, where the I/O elements are formed, the semiconductor element 100 according to the exemplary embodiment may solve the above-described issues of a leakage current increase and a reliability deterioration of the I/O element.

In the case of the complementary FET cFET applied to the logic elements, because the complementary FET cFET has a quadruple-gate structure, the performance of the logic elements may be improved. Furthermore, in the case of the logic elements, the complementary FETs cFET having various sizes and structures may be used, and there may be the complementary FET cFET, to which a voltage equal to or greater than a constant voltage is required to be applied for functions similar to those of the I/O element.

Figure 7:
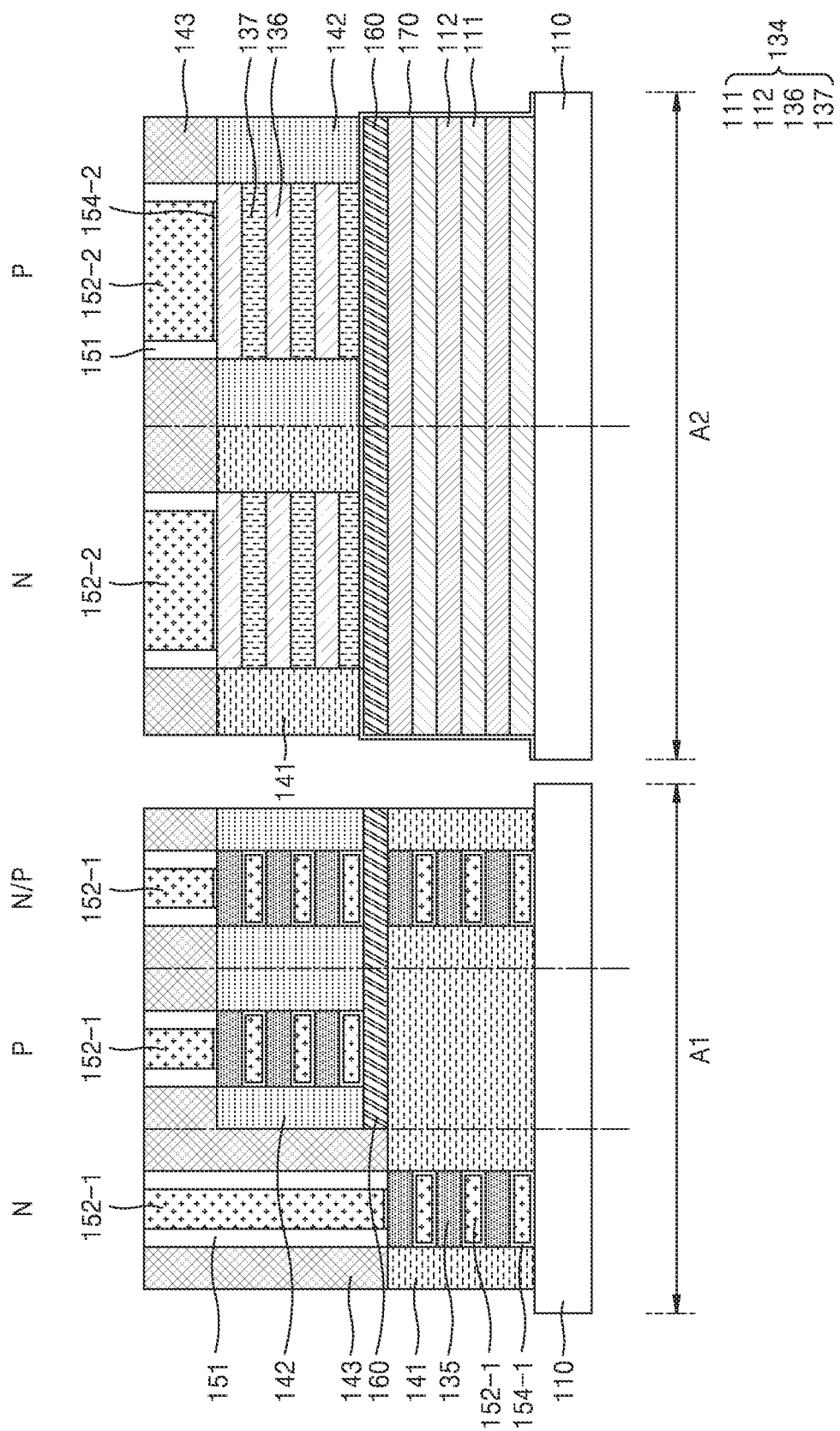
FIG. 7 is a cross-sectional view of a region VII-VII' of a semiconductor element of FIG. 3.

FIG. 7 is a cross-sectional view of a region VII-VII' of the semiconductor element 100 of FIG. 3.

Descriptions given with reference to FIGS. 1 through 6 are either briefly provided or omitted as redundant. In FIG. 7, for convenience of description, the first region A1 and the second region A2 are illustrated on the same first surface. FIG. 7, illustrates as an example that the complementary FET cFET having three regions is arranged in the first region A1, and the zebra fin FET ZE FINFET having two regions is arranged in the second region A2. An n-type transistor, a p-type transistor, and an n/p-type transistor may be arranged in the three regions of the first region A1, respectively, and an n-type transistor and a p-type transistor may be arranged in the two regions of the second region A2, respectively.

Referring to FIG. 7, the nano sheet stacked structure 135 may be over the substrate 110 in the first region A1. In FIG. 7, for convenience of description, an illustration of the first active fin 131 is omitted. As described above, the first active fin 131 may include the same material as the substrate 110.

The first gate electrode 152-1 and the nano sheet stacked structure 135 may be formed over the substrate 110. The nano sheet stacked structure 135 may include the plurality of first nano sheets separate from each other in the first direction (Z direction) and/or the third direction (X direction).

In some exemplary embodiments, a gate spacer 151 may be formed on both side walls of the first gate electrode 152-1. A source region 141 and a drain region 142 may be formed under both sides of the first gate electrode 152-1 and on both sides of the nano sheet stacked structure 135. An insulation layer 143 may be formed around a gate electrode 152 and the gate spacer 151.

The nano sheet layers 111 and 112 may be over the substrate 110 in the second region A2. The nano sheet layers 111 and 112 may form an active pattern on the second active fin 134 of the zebra fin FET ZE FINFET. The active pattern may include an active pattern of the zebra fin FET ZE FINFET. The active pattern may further include a plurality of semiconductor layers, for example, the second nano sheet 136 and the semiconductor pattern 137. The second nano sheet 136 and/or the semiconductor pattern 137 may include epitaxial layers. The second nano sheet 136 may include a SiGe layer, and the semiconductor pattern 137 may include a Si layer.

In another exemplary embodiment, the second active fin 132 of the planar FET plnr FET or the second active fin 133 of the general fin FET GE FINFET may be formed on the substrate 110. The second active fin 132 of the planar FET plnr FET or the second active fin 133 of the general fin FET GE FINFET may include a single semiconductor layer, for example, the second active fins 132 133 including a Si layer.

As described above, upper surfaces of the second active fins 132 and 133 of the planar FET and the general fin FET GE FINFET may be at a relatively higher level than the upper surface of the element separation layer 120.

As described above, the first dielectric layer 154-1 may be formed on the first active fin 131 of the complementary FET cFET or on the first nano sheets. The first gate electrode 152-1 may be formed on the first dielectric layer 154-1.

The second dielectric layer 154-2 may be formed on the second active fin 134 of the zebra fin FET ZE FINFET. The second gate electrode 152-2 may be formed on the second dielectric layer 154-2. The second dielectric layer 154-2 may also be formed on the second active fin 132 and the second active fin 133, of the planar FET plnr FET and the general fin FET GE FINFET, respectively. The second gate electrode 152-2 may be formed on the second dielectric layer 154-2.

The source region 141 and the drain region 142 may be formed under the second gate electrode 152-2 and on both sides of the second active fin 134 of the zebra fin FET ZE FINFET. The insulation layer 143 may be formed around the second gate electrode 152-2 and the gate spacer 151.

A lower region of the second region A2 may be surrounded by a zebra cap layer 170. The zebra cap layer 170 may include Si. In other words, the nano sheet layers 111 and 112 arranged in the lower region of the second region A2 may be surrounded by the zebra cap layer 170. Accordingly, a portion of the second active fin 134 may be surrounded by the zebra cap layer 170. The insulation layer 160 and the second active fin 134 under the insulation layer 160 may be surrounded by the zebra cap layer 170.

Figure 8B:
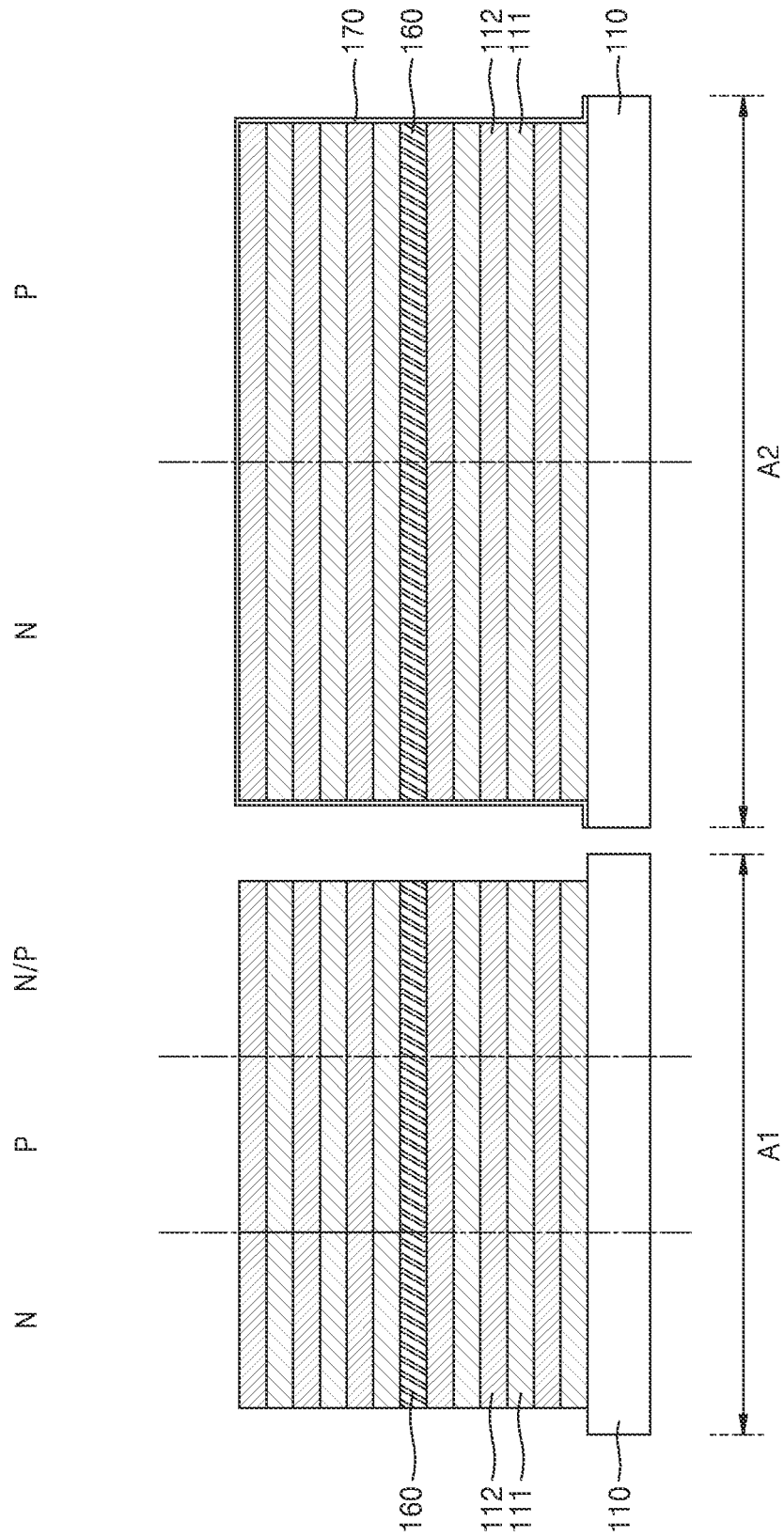
FIGS. 8A and 8E are cross-sectional views illustrating a process of fabricating a semiconductor device, according to exemplary embodiments.
Figure 8D:
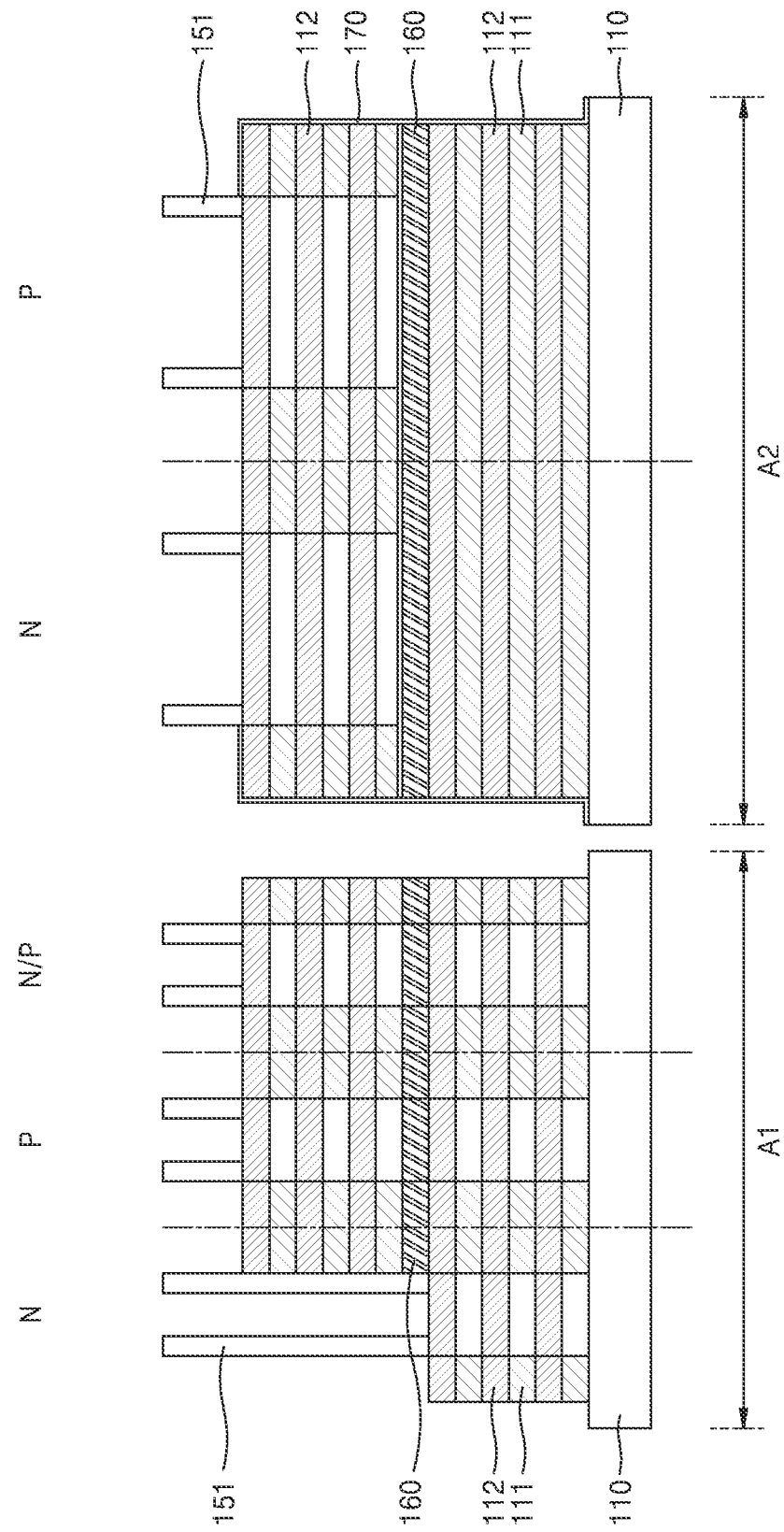
Figure 8E:
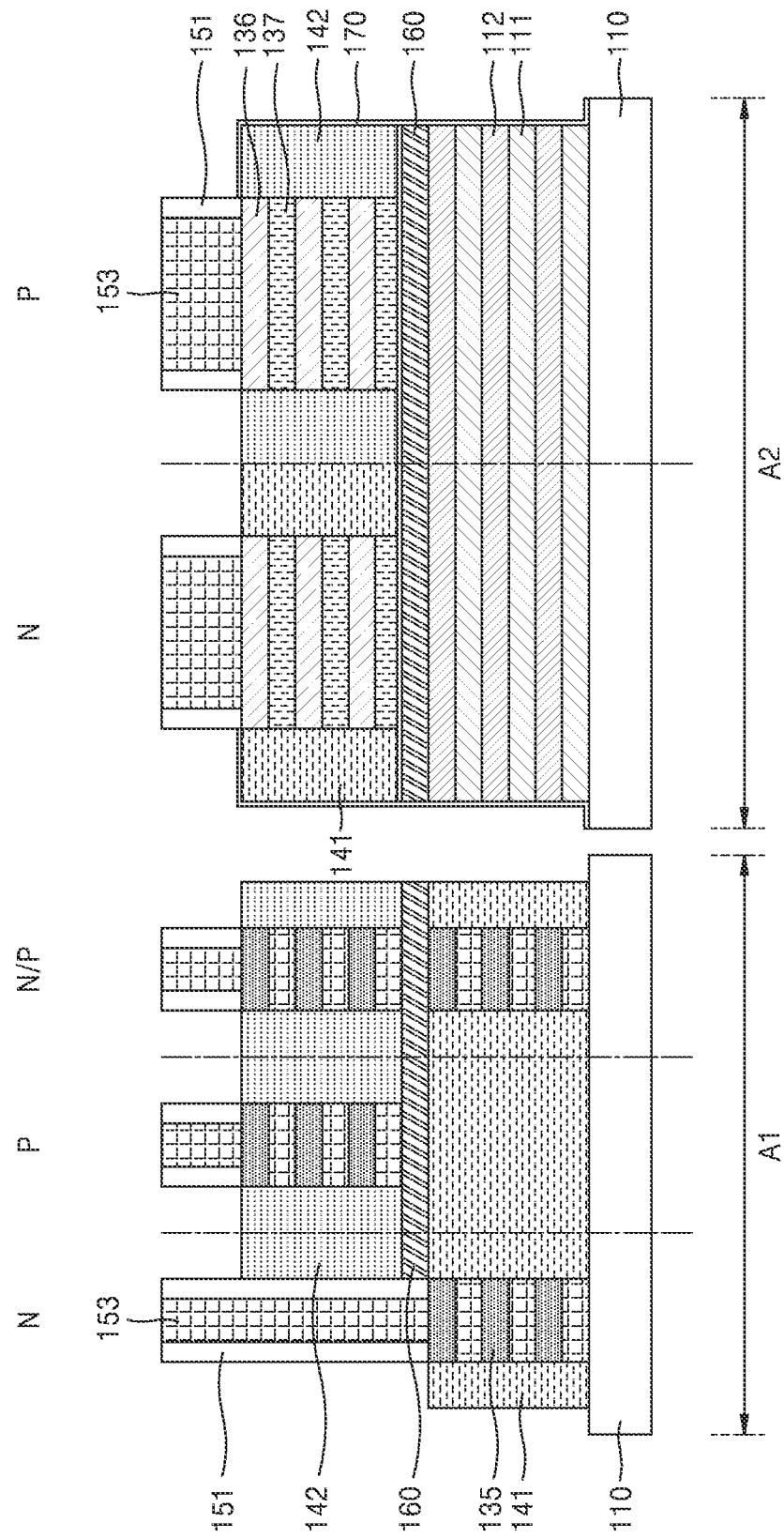

FIGS. 8A and 8E are cross-sectional views illustrating a process of fabricating the semiconductor device 100, according to exemplary embodiments.

For convenience, FIGS. 8A through 8E are described with an example, in which the complementary FET cFET is arranged in the first region A1, and the zebra fin FET ZE FINFET is arranged in the second region A2. It is illustrated as an example that the complementary FET cFET is divided into three regions, and an n-type transistor, a p-type transistor, and an n/p-type transistor are arranged in each region. In addition, it is illustrated as an example that the zebra fin FET ZE FINFET is divided into two regions, and an n-type transistor and a p-type transistor are arranged in respective regions.

Referring to FIG. 8A, firstly, the nano sheet layers 111 and 112 may be stacked multiple times over the substrate 110. Even though it is illustrated as an example in the drawings that six nano sheet layers 111 and 112 are stacked over the substrate 110, the number of stacked nano sheet layers 111 and 112 may be variously changed. The nano sheet layers 111 and 112 may include a Si layer and/or a SiGe layer.

The insulation layer 160 may also be stacked between the nano sheet layers 111 and 112. The insulation layer 160 may, at a later time, physically and/or electrically separate the nano sheet layers 111 and 112 and the gate structure 150 into the upper region and the lower region.

Referring to FIG. 8B, the nano sheet layers 111 and 112 in the second region A2 may be surrounded by the zebra cap layer 170. The zebra cap layer 170 may include Si. According to another exemplary embodiment, when the planar FET plnr FET or the general fin FET GE FINFET is formed in the second region A2, the zebra cap layer 170 may be omitted.

Referring to FIG. 8C, the upper region of the nano sheet layers 111 and 112 and the insulation layer 160 in a portion of the first region A1 may be etched. The etched area may be an area where an n-type transistor is to be arranged.

Referring to FIG. 8D, the gate spacer 151 for forming the gate electrode 152 may be formed. In addition, a portion of the nano sheet layer 111 may be etched. The etched portion in the first region A1 may be an area, where the gate electrode 152 and/or the source and drain regions 141 and 142 are to be formed afterwards. An etched portion in the second region A2 may be an area, where the semiconductor pattern 137 is to be formed afterwards.

Referring to FIG. 8E, a portion of the nano sheet layers 111 and 112 in the first region A1 may be etched, and the source and drain regions 141 and 142 may be formed. The nano sheet layer 112, which has not been etched, may be replaced by the nano sheet stacked structure 135.

The plurality of nano sheet layers 111 and 112, which have constituted the second active fin 134 in the upper region of the second region A2, may be replaced by the second nano sheet 136 and the semiconductor pattern 137, respectively. The plurality of nano sheet layers 111 and 112, which have not constituted the second active fin 134, may be replaced by a first semiconductor pattern and a second semiconductor pattern, respectively. The source and drain regions 141 and 142 may be formed in the first semiconductor pattern and the second semiconductor pattern, respectively. The first semiconductor pattern and the second semiconductor pattern may be formed by an epitaxial growth method.

However, the lower region of the second region A2 may not be replaced by the first semiconductor pattern and/or the second semiconductor pattern. This is because the lower region of the second region A2 is surrounded by the zebra cap layer 170. Accordingly, the lower region of the second region A2 may include the nano sheet layers 111 and 112 as described above.

In addition, before the gate electrode 152 is formed, a dummy gate 153 may be formed inside the gate spacer 151. The dummy gate 153 may include at least one of silicon oxide, silicon nitride, and silicon oxynitride.

Thereafter, the first and second gate electrodes 152-1 and 152-2 including a metal may be formed, based on the dummy gate 153 inside the gate spacer 151. In addition, when the insulation layer 143 is formed around the gate electrode 152 and the gate spacer 151, the semiconductor element 100 according to the exemplary embodiment may be fabricated. In other words, the semiconductor element 100 illustrated in FIG. 7 may be fabricated.

Figure 9:
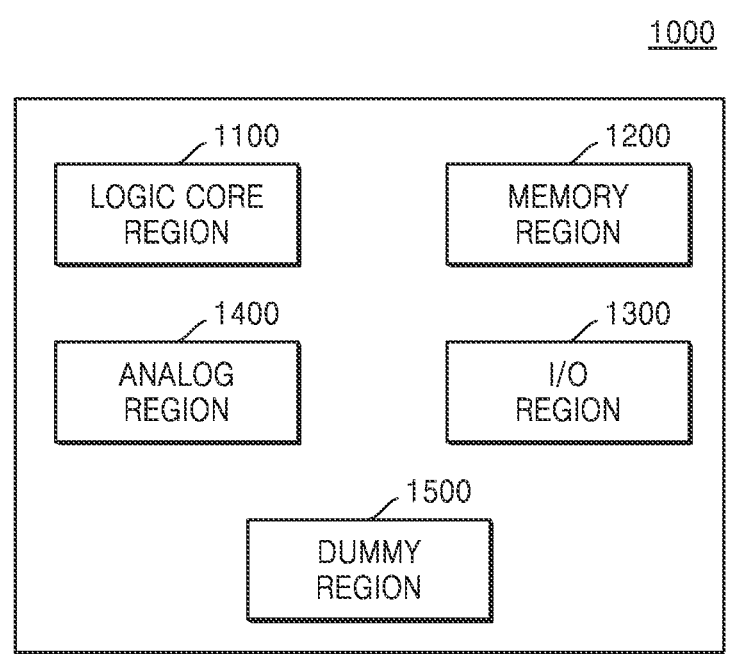
FIG. 9 is a conceptual diagram of device regions of a semiconductor element, according to an exemplary embodiment.

FIG. 9 is a conceptual diagram of device regions of a semiconductor element 1000, according to an exemplary embodiment.

Referring to FIG. 9, the semiconductor element 1000 of the exemplary embodiment may include a logic core region 1100, a memory region 1200, an I/O region 1300, an analog region 1400, and a dummy region 1500. The logic core region 1100 may correspond to the first region A1, where the logic elements are formed, in the semiconductor element 100 of FIG. 1, etc. The I/O region 1300 may correspond to the second region A2, where the I/O elements are formed, in the semiconductor element 100 of FIG. 1, etc. The I/O region 1300 may be referred to as a periphery device region. A memory element such as static random access memory (RAM) SRAM may be arranged in the memory region 1200. On the other hand, dummy patterns may be formed in the dummy region 1500.

In the semiconductor element 1000 of the exemplary embodiment, the complementary FET cFET having a quadruple-gate structure may be arranged in the logic core region 1100 or the memory region 1200, and the planar FET plnr FET or the fin FET FINFET having a mono-gate structure or a triple-gate structure may be arranged in the I/O region 1300 or the analog region 1400. In addition, the complementary FET cFET having a quadruple-gate structure as well as the planar FET plnr FET or the fin FET FINFET having a mono-gate structure or a triple-gate structure may be arranged in the logic core region 1100 or the memory region 1200. By properly combining the planar FET plnr FET or the fin FET FINFET having a mono-gate structure or a triple-gate structure with the complementary FET cFET having a quadruple-gate structure and arranging the resultant structure in this manner, the overall performance of the semiconductor element 1000 may be improved, and in addition, issues of leakage current and reliability thereof may be effectively solved.

Figure 10:
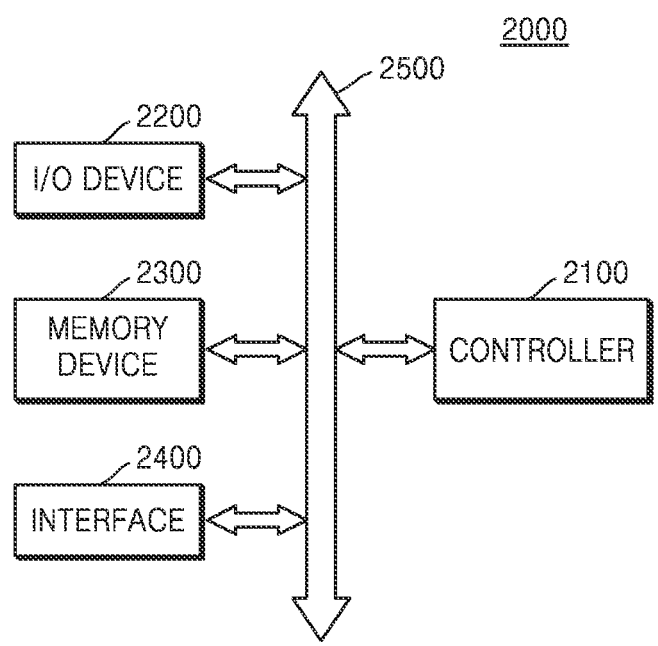
FIG. 10 is a schematic block configuration of an electronic system including field effect transistors having heterogeneous gate structures, according to an exemplary embodiment.

FIG. 10 is a schematic block configuration diagram of an electronic system 2000 including FETs having heterogeneous gate structures, according to an exemplary embodiment.

Referring to FIG. 10, the electronic system 2000 according to the exemplary embodiment may include a controller 2100, an I/O device 2200, a memory device 2300, an interface 2400, and a bus 2500. The controller 2100, the I/O device 2200, the memory device 2300, and/or the interface 2400 may be combined with each other via the bus 2500. The bus 2500 may correspond to a path, through which data moves between components.

The controller 2100 may include at least one of a microprocessor, a digital signal processor, a microcontroller, and logic elements capable of performing similar functions. The controller 2100 may include the logic elements formed in the first region A1 of the semiconductor elements 100 and 1000 according to the exemplary embodiments. The I/O device 2200 may include a keypad, a key board, a display device, etc. The I/O device 2200 may include the I/O elements formed in the second region A2 of the semiconductor elements 100 and 1000 according to the exemplary embodiments. The memory device 2300 may store data and/or commands. In addition, the memory device 2300 may further include a semiconductor memory device of a different type, for example, a non-volatile memory device and/or an SRAM device, etc. To the memory device 2300, a semiconductor element having a heterogeneous gate structure of the semiconductor elements 100 and 1000 according to the exemplary embodiments may even be applied. The interface 2400 may transmit data to or receive data from a communication network. The interface 2400 may have a wired or wireless design. For example, the interface 2400 may include an antenna, or a wired or wireless transceiver, etc. The interface 2400 may include the planar FET plnr FET having a mono-gate structure or the fin FET FINFET having a triple-gate structure formed in the second region A2 of the semiconductor elements 100 and 1000 according to the exemplary embodiments.

The electronic system 2000 may be applied to a personal digital assistant (PDA), a portable computer, a web tablet, a wireless phone, a mobile phone, a digital music player, a memory card, or all electronic products capable of transmitting and/or receiving information in a wireless environment.

While the inventive concept has been particularly shown and described with reference to exemplary embodiments thereof, it will be understood that various changes in form and details may be made therein without departing from the spirit and scope of the following claims.

What is claimed is:

1. An integrated circuit semiconductor element comprising:
   a substrate;
   a complementary field effect transistor (FET) (cFET) formed over the substrate and having a quadruple-gate structure in which nano sheet stacked structures are sequentially stacked; and
   a fin FET (FINFET) formed over the substrate and having a triple-gate structure, and spaced apart from the cFET in a first direction parallel to a surface of the substrate,
   wherein the cFET comprises a first active fin formed on the substrate, the nano sheet stacked structures formed over the first active fin, a first dielectric layer surrounding the nano sheet stacked structures, and a first gate electrode formed on the first dielectric layer,
   wherein the FINFET comprises a second active fin formed on the substrate, a second dielectric layer surrounding the second active fin, and a second gate electrode formed on the second dielectric layer,
   wherein an upper surface of the second active fin is at a higher level than an upper surface of the first active fin in a first second direction perpendicular to the surface of the substrate, and
   wherein the cFET comprises transistors of different conductivity types stacked alternately in the second direction.

2. The integrated circuit semiconductor element of claim 1, wherein the nano sheet stack structures extend in the first direction at a first height from the substrate, and have a first width in the first direction, the second active fin extends in the first direction at a second height from the substrate, and has a second width in the first direction, and the second width is greater than the first width.

3. The integrated circuit semiconductor element of claim 2, wherein a ratio of the second width to the first width ranges from about 150% to about 1000%.

4. The integrated circuit semiconductor element of claim 1, wherein the cFET has a first gate length corresponding to a width in a third direction crossing the first direction and the second direction of the first gate electrode, the FINFET has a second gate length corresponding to a width of the second gate electrode in the third direction, and the first gate length is equal to or less than the second gate length.

5. The integrated circuit semiconductor element of claim 4, wherein a ratio of the second gate length to the first gate length ranges from about 150% to about 1000%.

6. The integrated circuit semiconductor element of claim 1, wherein the second active fin comprises a general fin comprising a single semiconductor layer.

7. The integrated circuit semiconductor element of claim 1, wherein the second active fin comprises a zebra active fin comprising a plurality of semiconductor layers.

8. The integrated circuit semiconductor element of claim 7, wherein the FINFET comprises the second gate electrode formed on an upper surface and on both side surfaces of the second active fin, and comprises an insulation layer formed to penetrate the second gate electrode, parallel with the substrate, and configured to electrically or physically separate the second gate electrode.

9. The integrated circuit semiconductor element of claim 8, comprising a zebra cap layer surrounding an upper surface of the insulation layer from a lower surface of the second active fin.

10. The integrated circuit semiconductor element of claim 1, wherein the second active fin comprises at least one of silicon (Si) and silicon germanium (SiGe).

11. The integrated circuit semiconductor element of claim 1, wherein a cross-section of the second active fin perpendicular to a third direction crossing the first direction and the second direction has a rectangular structure.

12. The integrated circuit semiconductor element of claim 1, wherein, on the substrate, an element separation layer for electrically separating the first active fin and the second active fin is formed on side surfaces of the first active fin and on side surfaces of the second active fin.

13. The integrated circuit semiconductor element of claim 1,
wherein the cFET comprises an insulation layer formed to penetrate the first gate electrode and formed between the transistors of different conductivity types.

14. A method of fabricating an integrated circuit semiconductor element, the method comprising:
preparing a substrate on which a first region and a second region are defined and spaced apart from each other in a first direction parallel to a surface of the substrate;
forming a first active fin in the first region and a second active fin in the second region;
forming nano sheet stacked structures, sequentially stacked in the first region; and
forming a first gate electrode covering the first active fin, a second gate electrode covering the second active fin, a complementary field effect transistor (cFET) including the first active fin, and a fin FET (FINFET) including the second active fin,
wherein, the first active fin extends in a second direction different from the first direction and parallel to the surface of the substrate and has a first height in the first region and the nano sheet stacked structures are formed over the first active fin,
wherein, the second active fin extends in the second direction and has a second height in the second region,
wherein, the cFET is formed by forming a first gate electrode having a quadruple-gate structure covering both side surfaces, an upper surface, and a lower surface of the nano sheet stacked structures in the first region,
wherein, the FINFET is formed by forming a second gate electrode having a triple-gate structure covering both side surfaces and an upper surface of the second active fin in the second region, and
wherein the cFET comprises transistors of different conductivity types stacked alternately in the second direction.

15. The fabrication method of claim 14, wherein the second active fin comprises a zebra active pattern comprising a plurality of semiconductor layers.

* * * * *